(12) United States Patent
Edris et al.

(10) Patent No.: US 7,767,486 B2
(45) Date of Patent: Aug. 3, 2010

(54) HIGH-VOLUME ON-WAFER HETEROGENEOUS PACKAGING OF OPTICAL INTERCONNECTS

(75) Inventors: Mohammed Edris, Beaverton, OR (US); Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 179 days.

(21) Appl. No.: 11/943,973

(22) Filed: Nov. 21, 2007

(65) Prior Publication Data

US 2009/0129422 A1    May 21, 2009

(51) Int. Cl.
*H01L 33/00*    (2010.01)
*H01L 31/0203*    (2010.01)
(52) U.S. Cl. .................. 438/66; 438/28; 257/434; 257/E31.11; 257/E33.058; 372/50.124
(58) Field of Classification Search ............ 438/28, 438/66; 257/434, E31.11, E33.058; 372/50.124
See application file for complete search history.

(56) References Cited

U.S. PATENT DOCUMENTS 6,093,972 A * 7/2000 Carney et al. ............... 257/790
6,791,133 B2 * 9/2004 Farooq et al. ............... 257/296
7,009,300 B2    3/2006 Gacusan
2005/0121768 A1 * 6/2005 Edelstein et al. ............ 257/698
2008/0284037 A1 * 11/2008 Andry et al. ................ 257/774

OTHER PUBLICATIONS

J. U. Knickerbocker et al., "Development of next-generation system-on-package (SOP) technology based on silicon carriers with fine-pitch chip interconnection", IBM Journal of Research and Development, Power and Packaging, vol. 49 No. 4/5, 2005N.

* cited by examiner

*Primary Examiner*—Matthew Smith
*Assistant Examiner*—Walter H Swanson
(74) *Attorney, Agent, or Firm*—Kevin A. Reif

(57) ABSTRACT

An optical connector module complete with optoelectronic devices, supporting integrated circuitry, and connector housing may be fabricated on a wafer level. A plurality of cavities may be formed on the backside of the wafer to accommodate an optoelectronic device. Active circuitry may be formed in a front side of the wafer. Through-vias electrically connect the front side to the back side. The backside of the wafer is overmolded with a polymer layer which when singulated into individual dies forms the plastic housing of an optical connector module.

13 Claims, 5 Drawing Sheets

US 7,767,486 B2

HIGH-VOLUME ON-WAFER HETEROGENEOUS PACKAGING OF OPTICAL INTERCONNECTS

FIELD OF THE INVENTION

Embodiments of the invention are directed to heterogeneous packaging and, more particularly, wafer level fabrication of optical interconnects, including optical and electronic components.

BACKGROUND INFORMATION

As the power of processing devices exponentially increases, high bandwidth communication links interconnecting these processing devices are increasingly important. Optical media or carriers are capable of providing such high bandwidth communication links. To utilize optical carriers, optical-electrical interfaces are needed to interface the optical realm of the carrier with the electrical realm of the processing devices.

Typically, a waveguide device is used to couple light to and from optoelectronic dies. One type of optical-electrical interface uses a waveguide embedded within a substrate having a multi-terminal ("MT") connector to form a make and break connection with an external waveguide. The substrate may support a variety of electrical devices that interface with the embedded waveguide via an optoelectronic die. The optoelectronic die is electrically coupled to the substrate while at the same time carefully positioned to optically align with micro-mirrors integrated into the end of the embedded waveguide. These optical-electrical interfaces are generally manufactured using distinct components, which are fabricated separately, and cumbersomely assembled.

In known optical-electrical interfaces, such as the one described above, the drive and receiver circuitry are spatially separated from their respective optoelectronic devices. Typically laser drivers use a 50 ohm termination to drive the optical components through a transmission line. This is unfortunate since terminating the laser drivers with such resistance increases the power consumption significantly and should ideally be avoided for power efficient practical optical interconnect systems.

Further, such systems use active alignment techniques to obtain the necessary alignment precision. Active alignment entails manually aligning the optoelectronic die with the embedded waveguide while the optical-electrical interface is stimulated and observed with a photodetector or microscope for sufficient alignment. Manual active alignment is people intensive and does not lend itself well to high volume manufacturing ("HVM").

BRIEF DESCRIPTION OF THE DRAWINGS

The foregoing aspects and many of the attendant advantages of this invention will become more readily appreciated as the same becomes better understood by reference to the following detailed description when taken in conjunction with the accompanying drawings, wherein like reference numerals refer to like parts throughout the various views unless otherwise specified.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Many integrated circuits (i.e., chips) have a need for a large number of input and/or output (I/O) connections off the chip. Conventional packaging technologies such as wire bonding and over molded plastic chip scale packaging may be used to implement the off-chip connections. More recently, flip chip technology has been used to provide an increased number of I/O connections on the circuit side of the chip. Flip chips typically use conductive "bumps" formed on the surface of the circuit side of the flip chip, which are used to make off-chip connections to corresponding conductive regions on an interconnect substrate (e.g., ceramic, flexible tape), or printed wiring board or other interconnect structure.

However, the demand continues for even more I/O connections. At the same time, users typically desire a thin profile or pitch when the chips are packaged, along with short interconnections to facilitate high-speed signal transmission. So called system on package (SOP) or wafer level packaging (WLP) are technologies which may reduce the whole packaging process to a wafer level process that may be carried out at the backend of existing wafer fabrication facilities. This packaging technology lends itself well to current trends in larger wafer diameters, smaller die sizes, and increased circuit complexity.

Figure 1:
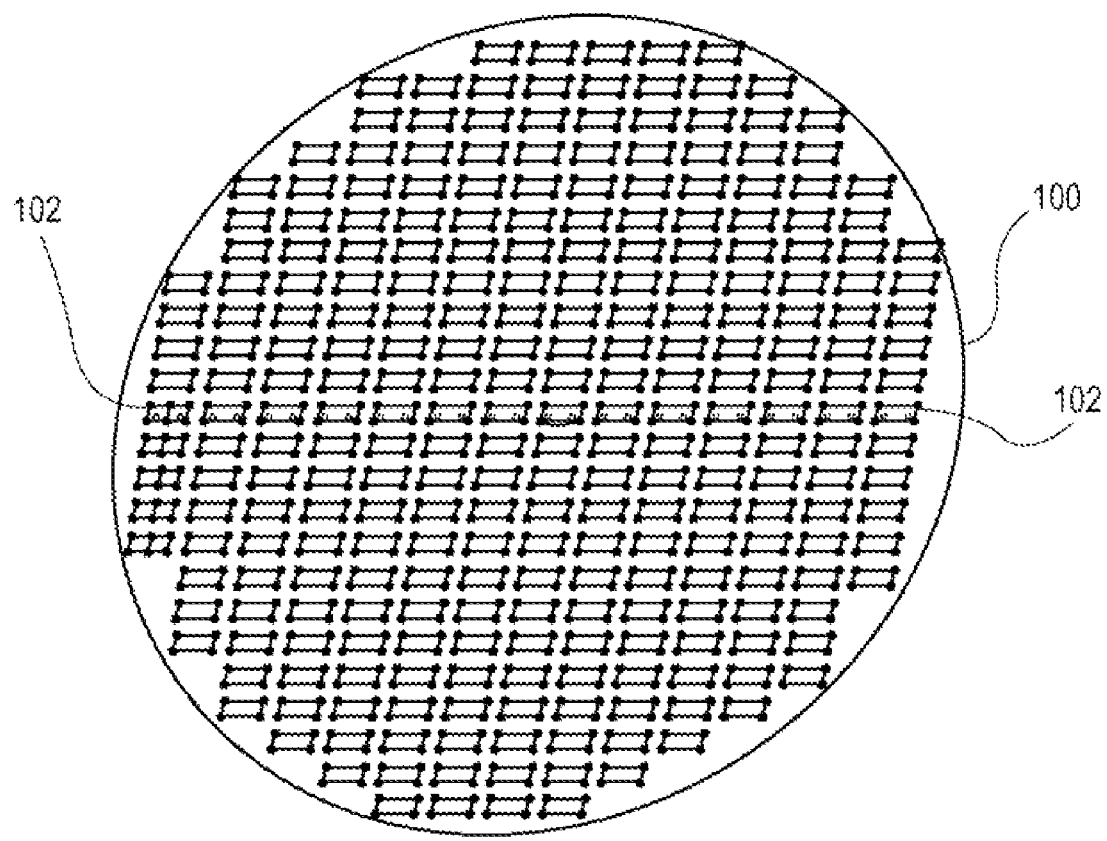
FIG. 1 is the back side of an Si wafer after electronic circuits to support an optical device have been integrated onto the front side.

Referring now to FIG. 1, there is shown the backside of a wafer 100. This embodiment may be performed as a wafer level packing (WLP) process, which can advantageously reduce per die fabrication costs in many applications. The wafer 100 may have a plurality of dice formed thereon with contacts on both sides of wafer.

In this embodiment, wafer 100 comprises a semiconductor substrate formed from a material such as, for example, crystalline silicon. In other embodiments, substrate may be formed from other semiconductor material or materials (e.g., Gallium Arsenide). Active circuitry is formed in a "front side" of the wafer 100. The front side of the wafer may have integrated optical transceiver circuits formed thereon, such as drivers, receivers, transimpedance amplifiers (TIAs), etc., used to support an optical transceiver.

A plurality of cavities 102 may be formed on the backside of the wafer 100. Three dimensional (3D) cavity formation is part of the Micro Mechanical System (MEMs) technology. Such definition of cavities could be achieved by standard lithography or laser machining methods.

Figure 2:
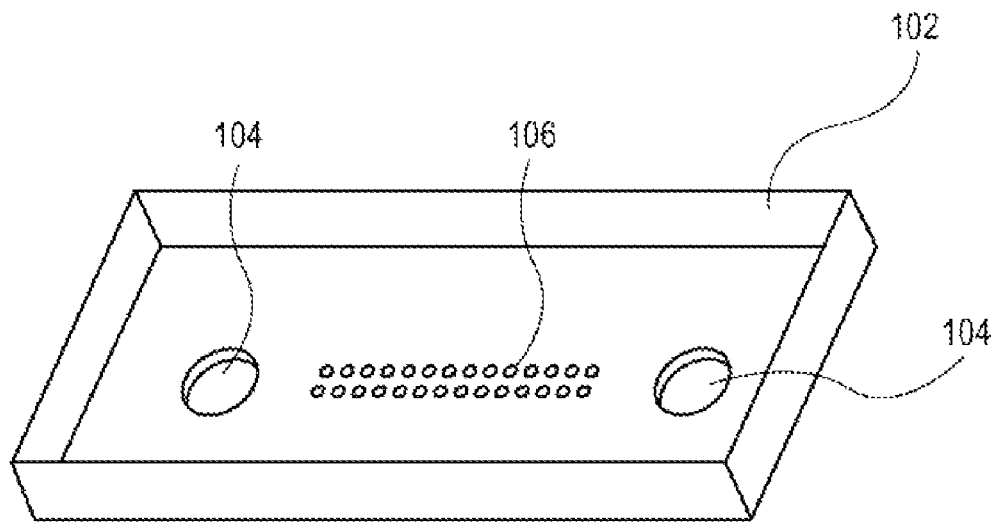
FIG. 2 is an expanded view of one die on the back side of the wafer showing a cavity and solder micro-C4 bump arrays to accommodate an optoelectronic device.

FIG. 2 shows a magnified view of one of the cavities 102. Guide holes 104 as well as a plurality of Si through vias 106 may be formed in the bottom of the cavity 102. The Si through-vias 106 with smooth straight walls and as deep as 300 um may be formed using the "via first" approach, as discussed, for example in J. U. Knickerbocker et al., "Development of next-generation system-on-package (SOP) technology based on silicon carriers with fine-pitch chip interconnection", IBM Journal of Research and Development, Power and Packaging, Vol. 49 No. 4/5, 2005. This approach is capable of forming free standing Si carrier or wafer. Such formation of deep vias may be achieved using methods such as Bosch-type reactive ion etch (RIE), cryogenic RIE etch, and various forms of isotropic/anisotropic wet etch. Next, the vias 106 may be filled with a conductive material, such as copper (Cu) and then solder bumps may be deposited on the top of the filled vias 106 inside the cavity 102.

Figure 3:
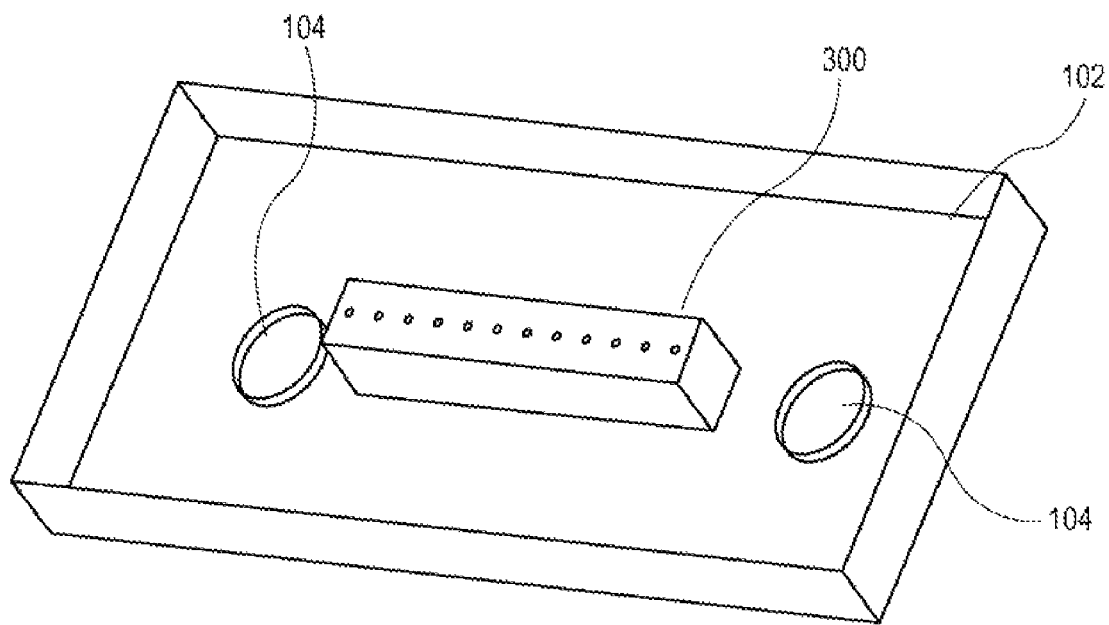
FIG. 3 is an expanded view of one die on the back side of the wafer including an optoelectronic device connected within the cavity to using micro-C4 flip-chip techniques.

As shown in FIG. 3, a vertical cavity surface emitting laser (VCSEL) array may be flip-chip mounted in the cavity 102 with the solder bumps. As the name implies, this type of laser is a semiconductor micro-laser diode that emits light in a coherent beam orthogonal to the surface of a fabricated wafer. VCSELs are compact, relatively inexpensive to fabricate in mass quantities, and may offer advantages over edge emitting laser which currently comprise the majority of the lasers used in today's optical communication systems. The more traditional type edge emitting laser diodes emit coherent light parallel to the semiconductor junction layer. In contrast, VCSELs emit a coherent beam perpendicular to the boundaries between the semiconductor junction layers. In other words, VCSELs emit a beam in a vertical direction from the substrate as opposed to emitting a beam in the same plane as the substrate. The emission of VCSELs may be tailored to come out either from the top or bottom surface of the substrate. Among other advantages, this may make it easier to couple the light beam to an optical fiber and may be more efficient.

VCSELs may be efficiently fabricated on wafers using standard microelectronic fabrication processes and, as a result, may be integrated on-board with other components. VCSELs may be manufactured using, for example, aluminum gallium arsenide (AlGaAs), gallium arsenide (GaAs), indium gallium arsenide nitride (InGaAsN), or similarly suited materials. VCSELS have been successfully manufactured in 850 nm, 1310 nm and 1550 nm ranges. This allows for a wide variety of fiber optic applications ranging from short reach applications to tong haul data communications. VCSELs are promising to advance optical communication systems by providing a fast, inexpensive, energy efficient, and more reliable source of laser beam generation.

As shown in FIG. 3, VCSEL 300 is a bottom emitting VCSEL with front side electrical bumps. The VCSEL 300 may be positioned over the solder bumps over the vias 106. Solder self alignment will position the VCSEL 300 precisely with respect to the guide holes 104 inside the cavity 102. The surface tension of molten solder causes corresponding pads on the VCSEL 300 and the bumps in the cavity 102 to self-align with each other. Of course, while a VCSEL 300 is shown for optical transmission, one skilled in the art wilt understand that that a photodiode array may also be used for an optical receiver.

Figure 4:
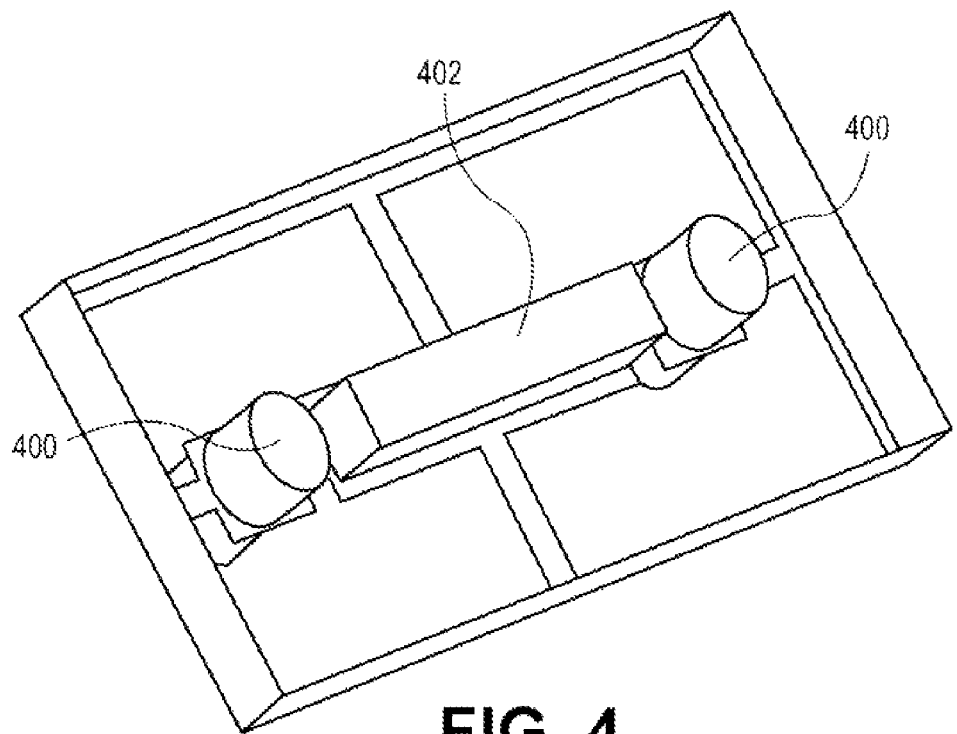
FIG. 4 is an expanded view of a mask that will be used to protect optoelectronic dies shown in FIG. 3 during polymer deposition.

In FIG. 4, protective masks are provided. As shown, a protective mask 400 is provided over the guide holes 104 (shown in FIG. 3) and a protective mask 402 is provided over the VCSEL array 300 (shown in FIG. 3). These masks 400 and 402 may be provided to protect the guide holes 104 and the VCSEL array 300 from damage that may occur in subsequent processing steps.

Figure 5:
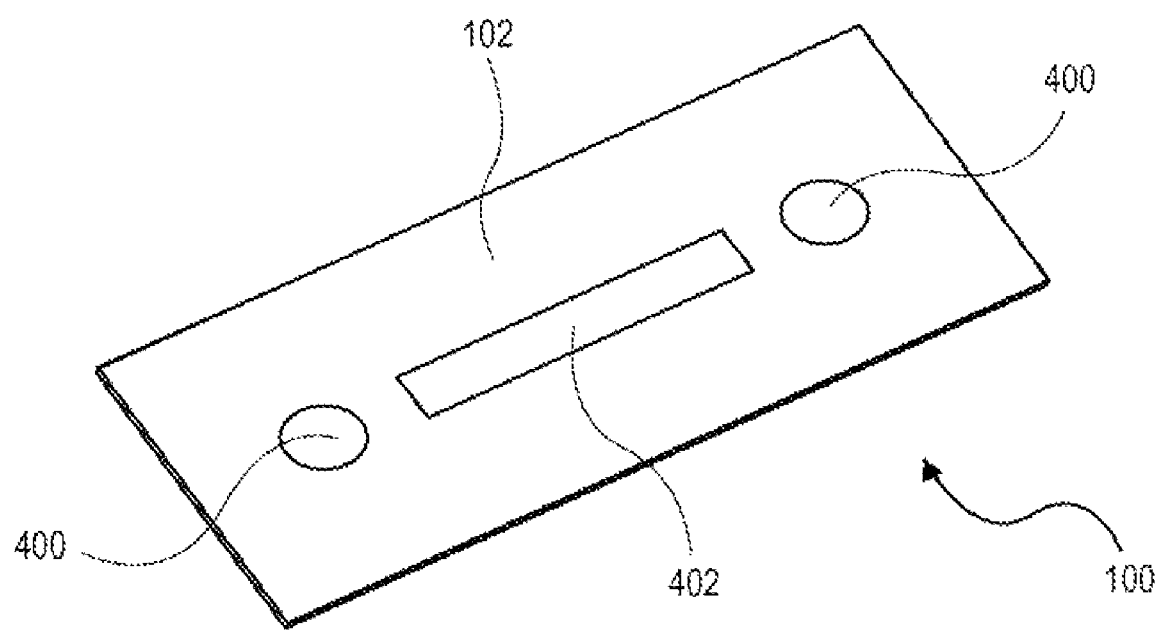
FIG. 5 is the expanded view of one die as shown in FIG. 4 after polymer deposition and planerization.

As shown in FIG. 5, the wafer 100 may then be spin coated with a polymer material. This material may be for example benzocyclobutene (BCB), polymide, epoxy, etc. The polymer material fills the cavity 102 and then the wafer 100 is planarized.

Figure 6:
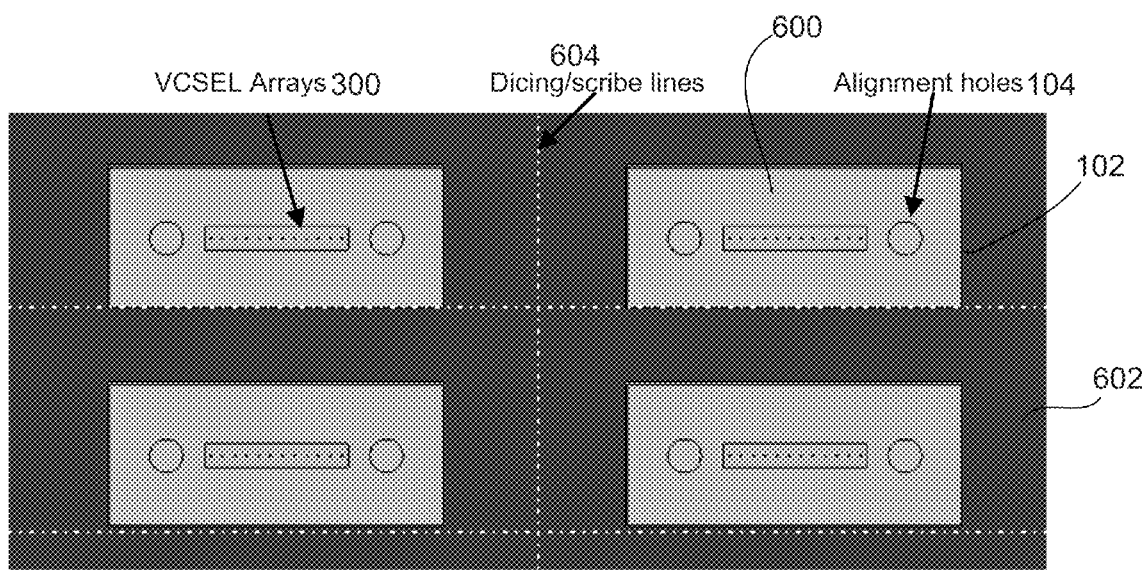
FIG. 6 is a view of several dice on the wafer prior to dicing after a thicker polymer overmold deposition for forming a connector housing.
Figure 8:
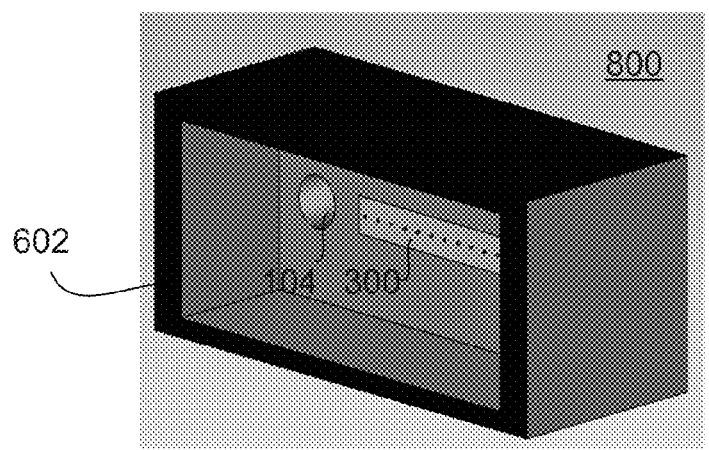
FIG. 8 is a view of a finished optoelectronic module formed after dicing the wafer according to one embodiment.

Referring now to FIG. 6, plastic connector housings are formed on the wafer 100. A mold 600 is placed over the cavity to protect the cavities containing the VCSEL devices 300 and the alignment holes 104. The mold 600, when removed, leaves a hollow portion that comprises the inner walls of the connector. The wafer is then overmolded with a polymeric material 602 such that in a subsequent dicing process along dicing scribe lines 604 a connector 800 is formed, as shown in FIG. 8. In the overmolding process, there does not need any precision molding as alignment has already been established by the wafer.

Figure 7:
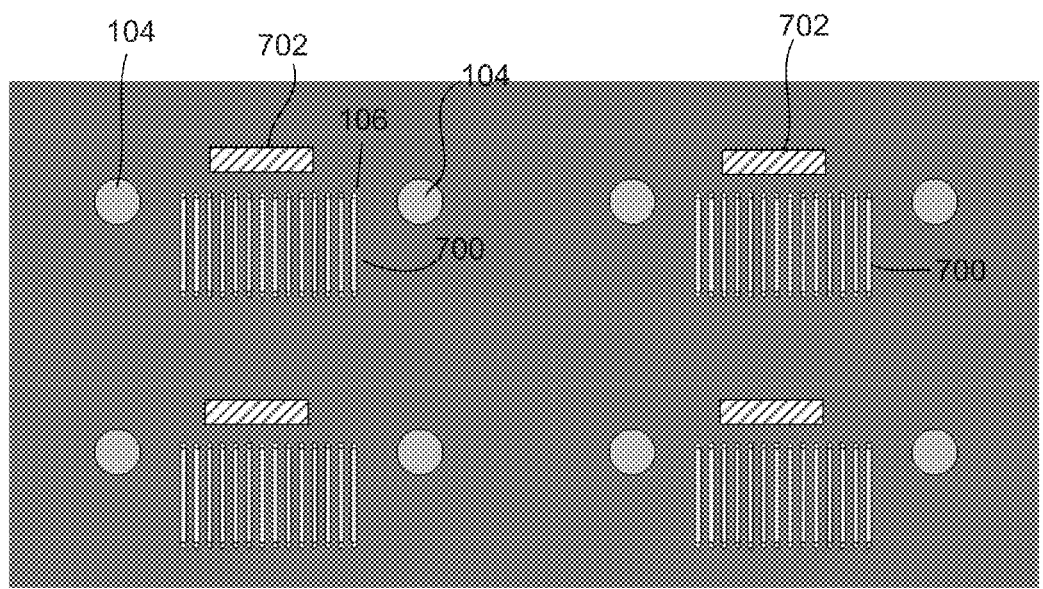
FIG. 7 is a view of the several dice shown in FIG. 6, as viewed from the front side of the wafer.

FIG. 7 is a view of the front side of the wafer 100 before dicing showing the guide holes 104 and the front side of the vias 106 connecting to metal traces 700. Also included on the front side of the wafer 100 may be optical transceiver circuits 702 integrated thereon, such as drivers, transimpedance amplifiers (TIAs), etc. As shown in FIG. 8, after dicing, a singulated die forms an individual optical connector 800 is formed already containing guide holes 104, the VCSEL array 106 and supporting integrated circuitry 702 (as shown in FIG. 7).

Figure 9A:
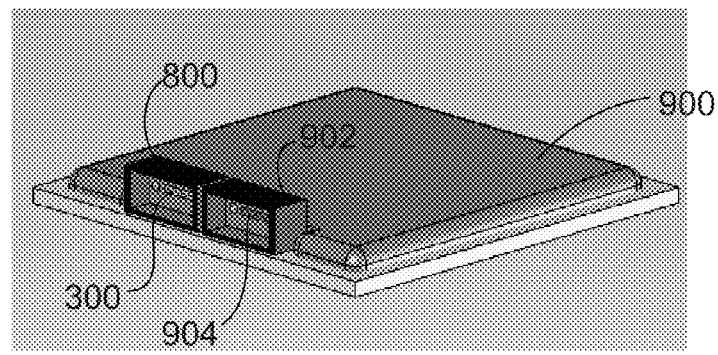
FIGS. 9A-9B are views of optical connector modules made according to the invention connected to, for example, a microprocessor.
Figure 9B:
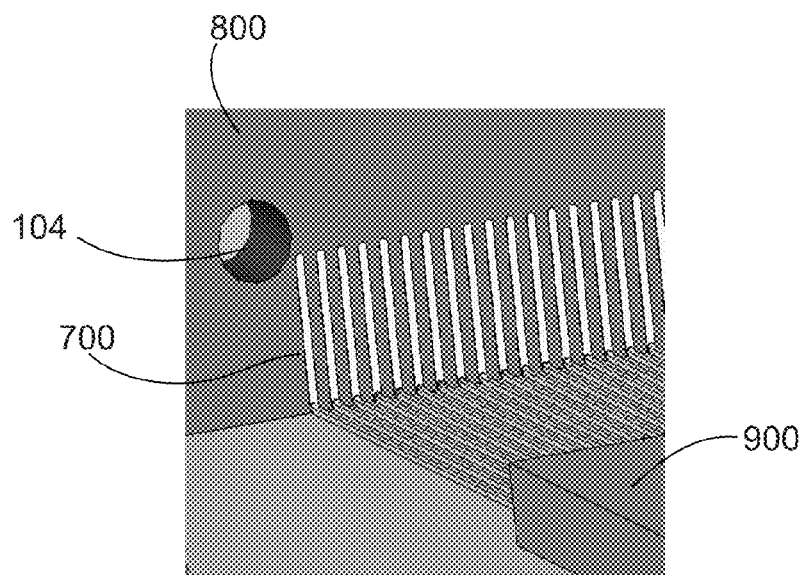

As shown in FIGS. 9A and 9B, the connector module 800 may be bonded onto microprocessor substrate 900 by electrically connecting the metal traces 700 on the front side to the substrate using a solder paste and an electrically conductive adhesive paste. The connector module 800 containing the VSCEL array 300 may comprise an optical transmitter. The second connector 902 shown in FIG. 9A, may be for example an optical receiver in which case, the VCSEL array 106 would be replaced by a photodiode array 904.

According to embodiments, integration of heterogeneous semiconductor technologies such as Si, Ge and III-V devices may be accomplished. The technology is capable of forming high density vias, micro-C4 bumps with much reduced pitch between bumps. Bump pitch as small as 50 um are achievable with bump diameter as low as 25 um. This capability has 2 significant consequences. First, it accommodates high I/O density in a much smaller volume which is important for Si real state. Second, optoelectronic device bumps will be scaled in a similar manner. This has a significant implication of cost reduction since III-V real estate expensive. As much as 4× cost saving may be possible. Further, there should be reduced power consumption since there are no 50 ohm transmission lines between VCSEL driver circuitry and VCSEL itself.

Embodiments are modular and provide for design flexibility. Systems and sub-systems may be manufactured as modules and the technology enables the integration of both electrical and optical active and passive devices, as well as the plastic connector housing on the wafer level. Thus, system level performance is enhanced because modular units could be optimized individually. In addition, embodiments leverage already existing high-volume semiconductor manufacturing machinery thus minimizing costs.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for making optical connector modules, comprising:
   forming a plurality of die on a wafer, the wafer having a front side and a back side;
   forming a plurality of three-dimensional cavities on the back side of the wafer;
   creating through vias to electrically connect the front side to the back side of the wafer;
   placing solder bumps on the vias;
   flip-chip bonding an optoelectronic device with the solder bumps in the cavity;
   overmolding the back side of the wafer with a polymer material, the polymer material forming a connector housing; and
   singulating the wafer to form individual optical connector modules.

2. The method as recited in claim 1, further comprising:
   forming integrated electronic circuits on front side of the wafer to support the optoelectronic device.

3. The method as recited in claim 2, wherein the optoelectronic device comprises a vertical cavity surface emitting laser (VCSEL) array.

4. The method as recited in claim 2 wherein the optoelectronic device comprises a photodiode array.

5. The method as recited in claim 2, further comprising:
   forming a pair of guide holes in each die between the front side of the wafer and the back side of the wafer.

6. The method as recited in claim 2, further comprising:
   forming metal interconnects connected to the vias on the front side of the wafer.

7. The method as recited in claim 2, further comprising:
   connecting an individual optical connector module to a microprocessor substrate using the metal interconnects.

8. A method for making optical connector modules, comprising:
   forming a plurality of die on a wafer, the wafer having a front side and a back side;
   forming a plurality of three-dimensional cavities on the back side of the wafer;
   creating through vias to electrically connect the front side to the back side of the wafer;
   placing solder bumps on the vias;
   flip-chip bonding an optoelectronic device with the solder bumps in the cavity;
   overmolding the back side of the wafer with a polymer material, the polymer material forming a connector housing;
   singulating the wafer to form individual optical connector modules; and
   forming integrated electronic circuits on front side of the wafer to support the optoelectronic device, wherein the overmolding comprises:
   placing a mold over the cavity;
   overmolding with a polymer material;
   removing the mold to form the opening of the connector module.

9. The method as recited in claim 8, wherein the optoelectronic device comprises a vertical cavity surface emitting laser (VCSEL) array.

10. The method as recited in claim 8, wherein the optoelectronic device comprises a photodiode array.

11. The method as recited in claim 8, further comprising:
    forming a pair of guide holes in each die between the front side of the wafer and the back side of the wafer.

12. The method as recited in claim 8, further comprising:
    forming metal interconnects connected to the vias on the front side of the wafer.

13. The method as recited in claim 8, further comprising:
    connecting an individual optical connector module to a microprocessor substrate using the metal interconnects.

* * * * *